(12) United States Patent
Wang et al.

(10) Patent No.: US 10,361,401 B2
(45) Date of Patent: Jul. 23, 2019

(54) ORGANIC ELECTROLUMINESCENT DISPLAY DEVICE AND DISPLAY APPARATUS

(71) Applicant: BOE TECHNOLOGY GROUP CO., LTD., Beijing (CN)

(72) Inventors: Jiliang Wang, Beijing (CN); Chungchun Lee, Beijing (CN); Xiaoguang Xu, Beijing (CN); Qinghui Zeng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 334 days.

(21) Appl. No.: 14/409,533

(22) PCT Filed: May 8, 2014

(86) PCT No.: PCT/CN2014/077028
§ 371 (c)(1),
(2) Date: Dec. 19, 2014

(87) PCT Pub. No.: WO2015/085705
PCT Pub. Date: Jun. 18, 2015

(65) Prior Publication Data
US 2016/0372713 A1    Dec. 22, 2016

(30) Foreign Application Priority Data

Dec. 10, 2013  (CN) .......................... 2013 1 0674013

(51) Int. Cl.
*H01L 51/52*    (2006.01)
(52) U.S. Cl.
CPC ...... *H01L 51/5293* (2013.01); *H01L 51/5253* (2013.01); *H01L 51/5281* (2013.01); *H01L 51/524* (2013.01); *H01L 2251/5338* (2013.01)

(58) Field of Classification Search
None
See application file for complete search history.

(56) References Cited

U.S. PATENT DOCUMENTS

| 5,507,404 A | 4/1996 | Ryu | |
|---|---|---|---|
| 2006/0220008 A1* | 10/2006 | Ko | H01L 27/322 257/40 |

(Continued)

FOREIGN PATENT DOCUMENTS

| CN | 101276012 A | 10/2008 |
|---|---|---|
| CN | 101645455 A | 2/2010 |

(Continued)

OTHER PUBLICATIONS

International Search Report and Written Opinion in PCT International Application No. PCT/CN2014/077028, dated Jul. 15, 2014.

(Continued)

*Primary Examiner* — Nishath Yasmeen
(74) *Attorney, Agent, or Firm* — Brooks Kushman P.C.

(57) ABSTRACT

The present invention discloses an organic electroluminescent display device and a display apparatus, wherein the organic electroluminescent display device employs an optical film lamination as a base substrate or a packaging cover plate, the optical film lamination includes a circular polarizer film, a water-oxygen resistant film and a color resistant film that are located on a supporting substrate, thus it has an antireflection function, a good water-oxygen resistance as well as a full-color display function, so that not only the problem of fussy process and high cost of an OLED display device caused by film application can be solved, but also the problem that the thickness of a flexible OLED display device is increased and thus the device is difficult to be rolled up due to film application is avoided; also, the OLED (Continued)

display device has the advantages of being lighter and thinner and having a better display effect, etc.

20 Claims, 2 Drawing Sheets

(56) References Cited

U.S. PATENT DOCUMENTS

| | | | | |
|---|---|---|---|---|
| 2007/0210703 | A1* | 9/2007 | Izzanni | H01L 27/322 |
| | | | | 313/504 |
| 2008/0018832 | A1* | 1/2008 | Lee | B29D 7/01 |
| | | | | 349/96 |
| 2008/0239489 | A1* | 10/2008 | Feng | G02B 5/3008 |
| | | | | 359/487.06 |
| 2011/0032456 | A1 | 2/2011 | Nakano et al. | |
| 2012/0119239 | A1 | 5/2012 | Kim et al. | |
| 2012/0242222 | A1* | 9/2012 | Jung | H01L 51/5253 |
| | | | | 313/512 |
| 2013/0032830 | A1* | 2/2013 | Lee | G02B 5/3041 |
| | | | | 257/88 |
| 2013/0193832 | A1* | 8/2013 | Jung | G02B 5/3083 |
| | | | | 313/112 |

FOREIGN PATENT DOCUMENTS

| | | |
|---|---|---|
| CN | 102916034 A | 2/2013 |
| CN | 102956671 A | 3/2013 |
| CN | 203260587 U | 10/2013 |
| CN | 103682156 A | 3/2014 |
| JP | 2002-141171 A | 5/2002 |

OTHER PUBLICATIONS

Office Action in Chinese Patent Application No. 201310674013.2, dated Jul. 1, 2015.

Office Action in Chinese Patent Application No. 201310674013.2, dated Dec. 15, 2015.

* cited by examiner

ORGANIC ELECTROLUMINESCENT DISPLAY DEVICE AND DISPLAY APPARATUS

CROSS-REFERENCE TO RELATED APPLICATION

This application is the U.S. national phase of PCT Application No. PCT/CN2014/077028 filed on May 8, 2014, which claims priority to Chinese Patent Application No. 201310674013.2 filed on Dec. 10, 2013, the disclosures of which are incorporated in their entirety by reference herein.

TECHNICAL FIELD

The present invention relates to the field of display technologies, and in particular, to an organic electroluminescent display device a display apparatus.

BACKGROUND

At present, in comparison with traditional liquid crystal display (LCD) device, organic electroluminescent display (OLED) device is gradually becoming the main stream in the display field due to its characteristics of fast response, wide color gamut, super-thinness and flexibility, etc.

The structure of an OLED display device mainly includes: a base substrate and an organic electroluminescent pixel array manufactured on the base substrate. Each organic electroluminescent pixel array includes: an anode and a cathode that are provided opposite to each other, and a light-emitting layer located between the anode and the cathode. The light emission of the OLED display device is realized by the light emission of an organic material in the light-emitting layer excited when the electrons in the cathode and the holes in the anode combine in the light-emitting layer. However, in the OLED display device, both the organic material of the light-emitting layer and the active metal of the cathode are extremely sensitive to aqueous vapor and oxygen, thus the OLED display device requires the technical support of a packaging technique more excellent than other display devices. If the OLED display device is packaged unreliably, aqueous vapor and oxygen will penetrate to the inside of the display from the ambient environment, resulting in oxidation of the cathode metal and deterioration of the organic material of the light-emitting layer, which will shorten the life time of the OLED display device or directly cause a fatal damage of the device and influence the normal use.

At present, for a medium-sized or small-sized OLED display device, packaging is generally implemented by employing a packaging mode using a glass cover plate. However, for a flexible or large-sized OLED display device, the existing technology generally employs the method that after a simple film packaging is performed on the OLED display device, a water-oxygen resistant film is applied, and then a circular polarizer needs to be applied after applying the water-oxygen resistant film, in order to inhibit a decrease of the display contrast and visibility due to the reflection of the ambient light by the OLED display device.

Additionally, in a full-color OLED display, when the light-emitting layer emits white light, a color resistant layer needs to be provided on the light-emitting side of the OLED display device so as to realize full-color display. For example, for a bottom-emission OLED display device, as shown in FIG. 1, generally, a color resistant layer 4 is directly manufactured on a base substrate 1, an organic electroluminescent pixel array 2 is manufactured on the color resistant layer 4, and then the organic electroluminescent pixel array 2 is packaged to form a packaging film 3; after packaging, a circular polarizer 5 is applied on the light-emitting side. For a top-emission OLED display device, generally, a color resistant layer is manufactured on a packaging cover plate, then it is oppositely arranged with an OLED substrate to form a cell for realizing full-color display, and thereafter, a water-oxygen resistant film and a circular polarizer are applied in sequence.

Thus it may be seen that, for a flexible or large-sized OLED display device, film application is required in the existing packaging method. As a result, the problem of fussy process and high cost may be caused; moreover, the problem that the thickness of a flexible device is increased and thus the flexible device is difficult to be rolled up may also be caused by film application.

SUMMARY

In view of this, the present invention provides an organic electroluminescent display device and a display apparatus, thereby solving the problem of fussy process and high cost and the problem that a flexible organic electroluminescent display device is difficult to be rolled up caused by the film application required in the existing organic electroluminescent display device.

In order to solve the above problems, one embodiment of the present invention provides an organic electroluminescent display device, which includes: a base substrate, an organic electroluminescent pixel array provided on the base substrate, and a packaging cover plate provided on the organic electroluminescent pixel array, wherein when a light-emitting side of the organic electroluminescent display device is a side where the packaging cover plate is located, the packaging cover plate is an optical film lamination; or, when the light-emitting side of the organic electroluminescent display device is a side where the base substrate is located, the base substrate is an optical film lamination;

the optical film lamination includes: a supporting substrate; and a circular polarizer film, a water-oxygen resistant film and a color resistant film that are located on the supporting substrate; wherein the supporting substrate is located on one side that is far away from the organic electroluminescent pixel array;

a light-incident side of the circular polarizer film faces the supporting substrate;

the water-oxygen resistant film is located on a light-emitting side of the circular polarizer film, and/or located between the light-incident side of the circular polarizer film and the supporting substrate; and the color resistant film is located on the light-emitting side of the circular polarizer film, or located between the light-incident side of the circular polarizer film and the supporting substrate.

In one example of the present invention, the water-oxygen resistant film may also function as a planarization layer, and it is provided on the surface of the color resistant film that is far away from the supporting substrate. Thus, a planarization layer may be omitted, and the overall thickness of the optical film lamination may be further thinned, which is more favorable for the lightening and thinning of the OLED display device.

In one example of the present invention, the water-oxygen resistant film may includes one of or a combination of:
- an inorganic material film; and
- a lamination of inorganic material film-organic material film-inorganic material film.

In another example of the present invention, the circular polarizer film may include: a phase difference film, a polarization functional film and a supporting film that are laminated in sequence, wherein
the phase difference film is the light-emitting side of the circular polarizer film, and the supporting film is the light-incident side of the circular polarizer film.

For example, a material of the polarization functional film may be polyvinyl alcohol or carbon nanotube.

In another example of the present invention, the circular polarizer film may include: a phase difference film and a polarization functional film, wherein
the phase difference film is the light-emitting side of the circular polarizer film, and the polarization functional film is the light-incident side of the circular polarizer film; and the material of the polarization functional film is carbon nanotube.

Another embodiment of the present invention provides a display apparatus, which includes the above organic electroluminescent display device according to the present invention.

The above technical solutions of the present invention have the following beneficial effects:

In the above technical solutions, an optical film lamination is employed as the base substrate or the packaging cover plate of the OLED display device, since the optical film lamination includes a circular polarizer film, a water-oxygen resistant film and a color resistant film, it may have an antireflection function, a good water-oxygen resistance as well as a full-color display function simultaneously, thus only the problem of fussy process and high cost of an OLED display device caused by film application can be solved, but also the problem that the thickness of a flexible OLED display device is increased and the device is difficult to be rolled up due to film application can be avoided; also, the OLED display device may also be made to have the advantages of being lighter and thinner and having a better display effect, etc.

DETAILED DESCRIPTION

Figure 1:
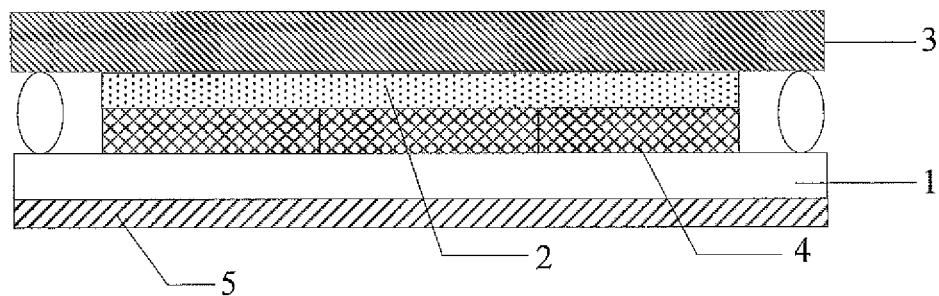
FIG. 1 is a structural representation of an existing organic electroluminescent display device.

Specific embodiments of the organic electroluminescent display device and the display apparatus according to the present invention will be illustrated in detail below in conjunction with the drawings.

Here, the thickness of each film in the drawings does not reflect the real scale of the organic electroluminescent display device, and it is only used for schematically illustrating the contents of the present invention.

1. Organic Electroluminescent Display Device

Figure 2A:
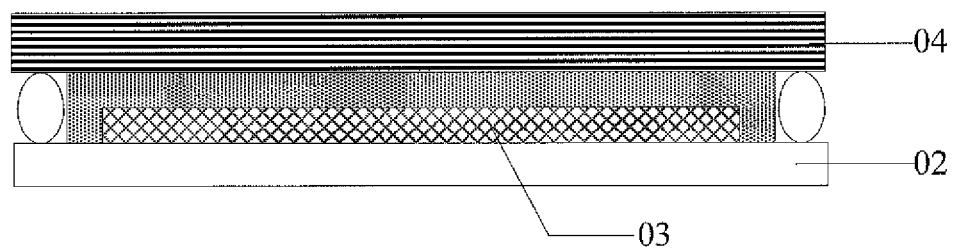
FIG. 2a and FIG. 2b respectively show a structural representation of an organic electroluminescent display device according to embodiments of the present invention.
Figure 2B:
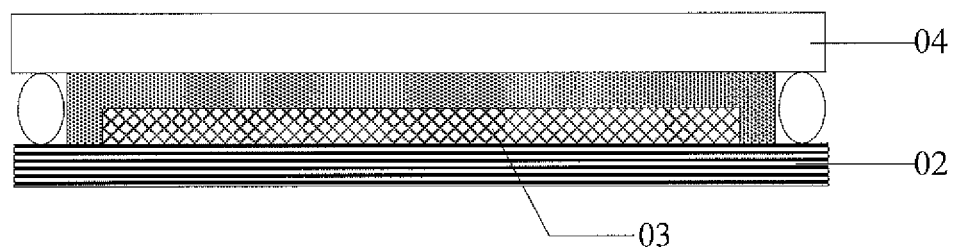

FIG. 2a and FIG. 2b respectively show a structural representation of an organic electroluminescent display device according to embodiments of the present invention. As shown in FIG. 2a and FIG. 2b, the organic electroluminescent display device according to these embodiments of the present invention includes: a base substrate 02, an organic electroluminescent pixel array 03 provided on the base substrate 02, and a packaging cover plate 04 provided on the organic electroluminescent pixel array 03. When the light-emitting side of the organic electroluminescent display device 03 is a side where the packaging cover plate 04 is located, as shown in FIG. 2a, the packaging cover plate 04 is an optical film lamination; when the light-emitting side of the organic electroluminescent display device 03 is a side where the base substrate 02 is located, as shown in FIG. 2b, the base substrate 02 is the optical film lamination.

Figure 3A:
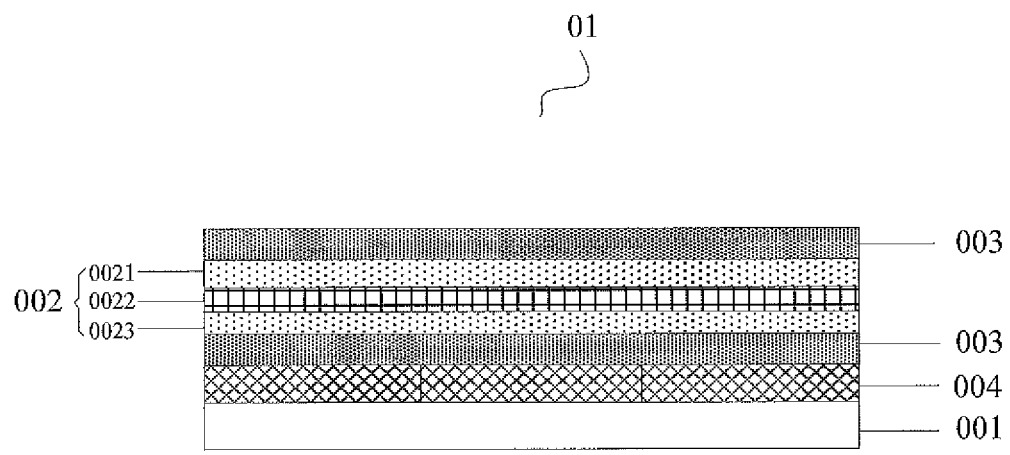
FIG. 3a and FIG. 3b respectively show a structural representation of an optical film lamination in embodiments of the present invention.
Figure 3B:
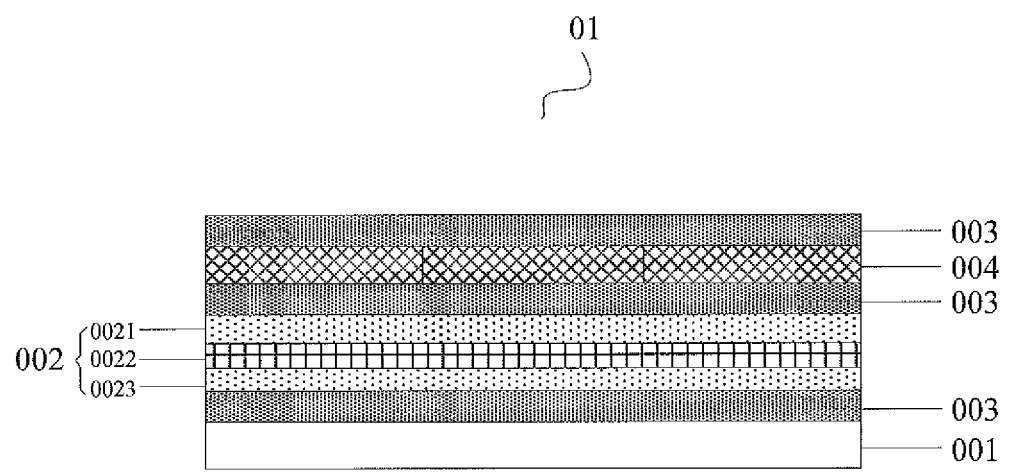

In the organic electroluminescent display device of the embodiments, as shown in FIG. 3a and FIG. 3b, the optical film lamination 01 includes: a supporting substrate 001, a circular polarizer film 002, a water-oxygen resistant film 003 and a color resistant film 004 which are located on the supporting substrate 001, wherein
the supporting substrate 001 is located on the side that is far away from the organic electroluminescent pixel array 03;
the light-incident side of the circular polarizer film 002 faces the supporting substrate 001;
the water-oxygen resistant film 003 is located on the light-emitting side of the circular polarizer film 002, and/or located between the light-incident side of the circular polarizer film 002 and the supporting substrate 001;
the color resistant film 004 may be, as shown in FIG. 3b, located on the light-emitting side of the circular polarizer film 002; or, it may be, as shown in FIG. 3a, located between the light-incident side of the circular polarizer film 002 and the supporting substrate 001.

When the organic electroluminescent display device of this embodiment is used as a top-emission OLED display device, as shown in FIG. 2a, the optical film lamination may be used as the packaging cover plate 04 of the OLED display device; in this case, the supporting substrate in the optical film lamination should be located on the side far away from the organic electroluminescent pixel array. When it is used as a bottom-emission OLED display device, as shown in FIG. 2b, the optical film lamination may be used as the base substrate 02 of the OLED display device; in this case, the supporting substrate in the optical film lamination should be located on the side far away from the organic electroluminescent pixel array.

In the organic electroluminescent display device of this embodiment, the organic electroluminescent pixel array 03 may include a plurality of organic electroluminescent structures each of which is consisted of an anode, a cathode and a light-emitting layer located between the anode and the cathode. The specific structure of such an organic electroluminescent pixel array 03 exists in the prior art, and no further description will be given again here.

According to this embodiment, since the optical film lamination includes a circular polarizer film, a water-oxygen resistant film and a color resistant film, it may have an antireflection function, a good water-oxygen resistance as well as a full-color display function. In addition, it not only can solve the problem of fussy process and high cost of an OLED display device caused by film application, but also can avoid the problem that the thickness of a flexible OLED display device is increased and thus the device is difficult to be rolled up due to film application; also, the OLED display device may also be made to have the advantages of being lighter and thinner and having a better display effect, etc.

The optical film lamination according to embodiments of the present invention will be further illustrated in detail below in conjunction with FIG. 3a and FIG. 3b. In this embodiments, in the above optical film lamination 01, as shown in FIG. 3a and FIG. 3b, the water-oxygen resistant film 003 may be provided, for example, on the light-emitting side of the circular polarizer film 002. As a result, when the above optical film lamination 01 is applied in an OLED display device as a packaging cover plate or base substrate, the water-oxygen resistant film 003 is relatively near the organic electroluminescent pixel array in the OLED display device, so that it can have a better waterproof and oxygenproof action on the organic electroluminescent pixel array.

Additionally, in the above optical film lamination 01, as shown in FIG. 3a and FIG. 3b, a water-oxygen resistant film 003 may also be provided between the light-incident side of the circular polarizer film 002 and the supporting substrate 001, which is not limited here.

In order to have a further waterproof and oxygenproof action on the organic electroluminescent pixel array, a plurality of the water-oxygen resistant films 003 may also be provided in the above optical film lamination 01. For example, as shown in FIG. 3a and FIG. 3b, water-oxygen resistant films 003 may be provided both on the light-emitting side of the circular polarizer film 002 and between the light-incident side of the circular polarizer film 002 and the supporting substrate 001. Thus, double waterproof and oxygenproof actions may be laid on the organic electroluminescent pixel array in the OLED display device. However, this will increase the overall thickness of OLED display device. Therefore, the number of water-oxygen resistant films required may be provided according to practical requirement.

In addition, when water-oxygen resistant films 003 are provided on both sides of the circular polarizer film 002, the structures of the water-oxygen resistant films 003 located on the two sides of the circular polarizer film 002 may be the same or different, which is not limited here.

For example, the water-oxygen resistant film 003 may include one of or a combination of:
an inorganic material film; and
a lamination of inorganic material film-organic material film-inorganic material film.

Here, a material of the inorganic material film may be, for example, one of or a combination of two or more of: aluminum oxide (Al2O3), titanium dioxide (TiO2), silicon nitride ($SiN_x$) or silicon carbide (SiC). When the structure of the water-oxygen resistant film includes a plurality of inorganic material films, the material of the inorganic material films may be the same or may be different, which is not limited here.

Further, in the above optical film lamination 01, the water-oxygen resistant film 003 may also be used as a planarization layer of the color resistant film 004. That is, as shown in FIG. 3a and FIG. 3b, a water-oxygen resistant film 003 is always exists on the surface of the color resistant film 004 that is far away from the supporting substrate 001. Thus, the planarization layer which has to be manufactured on the color resistant film as in the prior art can be omitted, and the film structure may be simplified, and the overall thickness of OLED display device may be reduced, which is favorable for the lightening and thinning of the OLED display device.

In the above optical film lamination 01, the circular polarizer film 002 mainly functions to prevent a reflected light to pass through. As shown in FIG. 3a and FIG. 3b, the circular polarizer film 002 may includes: a phase difference film 0021, a polarization functional film 0022 and a supporting film 0023 that are laminated in sequence, wherein the phase difference film 0021 is the light-emitting side of the circular polarizer film 002, and the supporting film 0023 is the light-incident side of the circular polarizer film 002.

Here, the supporting film 0023 mainly functions to support and protect the polarization functional film 0022. The material of the supporting film 0023 may be, for example, cycloolefin polymer (COP), polycarbonate (PC) or cellulose triacetate (TAC), and the thickness thereof may be, for example, 10 nm~100 um. The polarization functional film 0022 mainly functions to convert the natural light passing through the polarization functional film 0022 into linearly-polarized light. The material of the polarization functional film 0022 may be polyvinyl alcohol (PVA) or carbon nanotube (CNT), which is not limited here. The phase difference film 0021 may be, for example, a quarter-wave retardation plate, and it mainly functions to convert a linearly-polarized light passing through it into a circularly-polarized light, or to convert a circularly-polarized light passing through it into a linearly-polarized light. The material of the phase difference film 0021 may be, for example, cellulose triacetate (TAC) or polymethyl methacrylate, and the thickness thereof may be, for example, 1 um~100 um.

The operating principle of the circular polarizer film 002 is as follows: the polarization functional film 0022 and the phase difference film 0021 are combined, a natural light enters from the polarization functional film 0022, and it is changed to a linearly-polarized light after passing through the polarization functional film 0022, then the linearly-polarized light is changed from a linearly-polarized light to a left-handed circularly-polarized light after passing through the phase difference film 0021, thereafter, when the left-handed circularly-polarized light is reflected back, it becomes to a right-handed circularly-polarized light, and when it passes through the phase difference film 0021 again, it is changed from a right-handed circularly-polarized light to a linearly-polarized light; the linearly-polarized light at this time is vertical to the former linearly-polarized light and it cannot pass through a linear polarizer, so that the reflected light cannot penetrate through the polarization functional film 0022, thereby the influence of the ambient light may be reduced, and the contrast may be increased.

Further, when polyvinyl alcohol (PVA) is selected as the material of the polarization functional film 0022, the PVA material may be modified to have hydrophobicity. Thus, not only the probability of hydrolysis of the polarization functional film 0022 made of PVA material may be lowered, which makes the polarization functional film 0022 have a better polarization action, but also, when the optical film lamination 01 is applied in an OLED display device, it may also functions to protect the organic electroluminescent pixel array.

In addition, when carbon nanotube (CNT) is selected as the material of the polarization functional film 0022, the polarization functional film 0022 may be, for example, formed by laminating 10 to 30 layers of carbon nanotube films which are superparamagnetically-arranged. Here, in each layer of carbon nanotube film, carbon nanotubes with a uniform size are connected end to end along the extending direction of the carbon nanotube and arranged in a preferred orientation along the same direction.

Further, in comparison with a polarization functional film manufacture by polyvinyl alcohol, in the polarization functional film manufactured by carbon nanotubes, superparamagnetically-arranged carbon nanotubes have a uniform absorption characteristic for the lights of each wavelength and the carbon nanotubes have strong high-temperature resistance and high-humidity resistance, a good flexibility and a good light transmittance, therefore, the polarization functional film manufactured by carbon nanotubes is not only applicable for a common OLED display device and a flexible OLED display device, but also applicable in severe conditions such as high temperature and high humidity, etc. Meanwhile, the carbon nanotubes have a self-support capability, thus when carbon nanotubes are employed to manufacture the polarization functional film in the circular polarizer film, a supporting film may be omitted in the structure, and the structure and the preparation process of the optical film lamination becomes simpler.

Specifically, when carbon nanotubes are employed as the material of the polarization functional film 0022, the supporting film 0023 may be omitted in the structure of the circular polarizer film 002, that is, the circular polarizer film 002 only includes: the phase difference film 0021 and the polarization functional film 0022, wherein the phase difference film 0021 is the light-emitting side of the circular polarizer film 002, and the polarization functional film 0022 is the light-incident side of the circular polarizer film 002.

In addition, the above optical film lamination 01 may be prepared in a roll-to-roll mode.

2. Display Apparatus

Based on the same inventive concept, another embodiment of the present invention further provides a display apparatus, which includes the above organic electroluminescent display device of the present invention. Because the principle employed by the display apparatus to solve the problem is similar to that of the above organic electroluminescent display device, for the implementation of the display apparatus, reference may be made to the implementation of the above organic electroluminescent display device, and no further description will be given again here for the repeated parts.

In the display apparatus of the present invention, an optical film lamination is employed as a base substrate or a packaging cover plate of an OLED display device, and the optical film lamination includes a circular polarizer film, a water-oxygen resistant film and a color resistant film that are located on a supporting substrate, thus it may have an antireflection function, a good water-oxygen resistance as well as a full-color display function. Therefore, it not only can solve the problem of fussy process and high cost of the OLED display device caused by film application, but also can avoid the problem that the thickness of a flexible OLED display device is increased and thus the device is difficult to be rolled up due to film application; also, the OLED display device may be made to have the advantages of being lighter and thinner and having a better display effect, etc.

Apparently, various modifications and variations may be made by one skilled in the art without departing from the spirit and scope of the present invention. Thus, if these modifications and variations of the present invention fall into the scope of the claims of the present invention and their equivalents, the present invention intends to encompass these modifications and variations.

The above description only shows some preferred implementations of the present invention. It should be noted that, various improvements and substitutions may be made by one of ordinary skills in the art without departing from the technical principles of the present invention. Therefore, all these improvements and substitutions should be construed as falling into the protection scope of the present invention.

What is claimed is:

1. An organic electroluminescent display device, comprising: a base substrate, an organic electroluminescent pixel array provided on the base substrate and a packaging cover plate provided on the organic electroluminescent pixel array, wherein the light-emitting side of the organic electroluminescent display device is a side where the base substrate is located, and the base substrate is an optical film lamination;

the optical film lamination comprises: a supporting substrate, and a circular polarizer film, a plurality of water-oxygen resistant films and a color resistant film that are located on the supporting substrate; wherein the supporting substrate is located on a side of the optical film lamination farthest from the organic electroluminescent pixel array;

a light-incident side of the circular polarizer film faces the supporting substrate;

a first water-oxygen resistant film and a second water-oxygen resistant film of the plurality of the water-oxygen resistant films are respectively arranged on two sides of the circular polarizer film and prevent water and oxygen from penetrating to the two sides of the circular polarizer film, the first water-oxygen resistant film is located on a light-exiting side of the circular polarizer film, and the second water-oxygen resistant film is located between the light-incident side of the circular polarizer film and the supporting substrate;

the color resistant film is located on the light-exiting side of the circular polarizer film; and a third water-oxygen resistant film of the plurality of water-oxygen resistant films is configured as a planarization layer and is provided on a surface of the color resistant film that is far away from the supporting substrate, and the first water-oxygen resistant film is arranged between the circular polarizer film and the color resistant film, wherein each of the plurality of the water-oxygen resistant films comprises one of or a combination of:

an inorganic material film; and a lamination of inorganic material film, organic material film, and inorganic material film laminated in sequence, wherein the circular polarizer film comprises: a phase difference film, a polarization functional film and a supporting film that are laminated in sequence.

2. The organic electroluminescent display device according to claim 1, wherein a material of the inorganic material film is one of or a combination of two or more of: aluminum oxide, titanium dioxide, silicon nitride or silicon carbide.

3. The organic electroluminescent display device according to claim 1, wherein
the phase difference film is the light-emitting side of the circular polarizer film, and the supporting film is the light-incident side of the circular polarizer film.

4. The organic electroluminescent display device according to claim 3, wherein a material of the polarization functional film is polyvinyl alcohol or carbon nanotube.

5. The organic electroluminescent display device according to claim 4, wherein the material of the polarization functional film is modified polyvinyl alcohol.

6. The organic electroluminescent display device according to claim 4, wherein the polarization functional film is formed by laminating 10 to 30 layers of carbon nanotube films which are superparamagnetically arranged.

7. The organic electroluminescent display device according to claim 3, wherein a material of the supporting film is cycloolefin polymer, polycarbonate or cellulose triacetate.

8. The organic electroluminescent display device according to claim 3, wherein a material of the phase difference film is cellulose triacetate or polymethyl methacrylate.

9. The organic electroluminescent display device according to claim 1, wherein the circular polarizer film comprises: a phase difference film and a polarization functional film, wherein
the phase difference film is the light-emitting side of the circular polarizer film, and the polarization functional film is the light-incident side of the circular polarizer film; and
a material of the polarization functional film is carbon nanotube.

10. A display apparatus, comprising an organic electroluminescent display device, wherein the organic electroluminescent display device comprises: a base substrate, an organic electroluminescent pixel array provided on the base substrate and a packaging cover plate provided on the organic electroluminescent pixel array, wherein when a light-emitting side of the organic electroluminescent display device is a side where the packaging cover plate is located, the packaging cover plate is an optical film lamination; or, when the light-emitting side of the organic electroluminescent display device is a side where the base substrate is located, the base substrate is the optical film lamination;
the optical film lamination comprises: a supporting substrate, and a circular polarizer film, a plurality of water-oxygen resistant films and a color resistant film that are located on the supporting substrate; wherein
the supporting substrate is located on a side of the optical film lamination farthest from the organic electroluminescent pixel array;
a light-incident side of the circular polarizer film faces the supporting substrate;
a first water-oxygen resistant film and a second water-oxygen resistant film of the plurality of the water-oxygen resistant films are respectively arranged on two sides of the circular polarizer film and prevent water and oxygen from penetrating to the two sides of the circular polarizer film, the first water-oxygen resistant film is located on a light-exiting side of the circular polarizer film, and the second water-oxygen resistant film is located between the light-incident side of the circular polarizer film and the supporting substrate;
the color resistant film is located on the light-exiting side of the circular polarizer film; and
a third water-oxygen resistant film of the plurality of the water-oxygen resistant films is configured as a planarization layer and is provided on a surface of the color resistant film that is far away from the supporting substrate, and the first water-oxygen resistant film is arranged between the circular polarizer film and the color resistant film,
wherein each of the water-oxygen resistant films comprises one of or a combination of:
an inorganic material film; and
a lamination of inorganic material film, organic material film, and inorganic material film laminated in sequence,
wherein the circular polarizer film comprises: a phase difference film, a polarization functional film and a supporting film that are laminated in sequence.

11. The display apparatus according to claim 10, wherein a material of the inorganic material film is one of or a combination of two or more of: aluminum oxide, titanium dioxide, silicon nitride or silicon carbide.

12. The display apparatus according to claim 10, wherein the phase difference film is the light-emitting side of the circular polarizer film, and the supporting film is the light-incident side of the circular polarizer film.

13. The display apparatus according to claim 12, wherein a material of the polarization functional film is polyvinyl alcohol or carbon nanotube.

14. The display apparatus according to claim 13, wherein the material of the polarization functional film is modified polyvinyl alcohol.

15. The display apparatus according to claim 13, wherein the polarization functional film is formed by laminating 10 to 30 layers of carbon nanotube films which are superparamagnetically arranged.

16. The display apparatus according to claim 10, wherein the circular polarizer film comprises: a phase difference film and a polarization functional film, wherein
the phase difference film is the light-emitting side of the circular polarizer film, and the polarization functional film is the light-incident side of the circular polarizer film; and
a material of the polarization functional film is carbon nanotube.

17. The organic electroluminescent display device according to claim 1, wherein each of the plurality of the water-oxygen resistant films consists of an inorganic material film.

18. The organic electroluminescent display device according to claim 1, wherein the first water-oxygen resistant film and the second water-oxygen resistant film located on arranged on the two sides of the circular polarizer film have the same structure.

19. The organic electroluminescent display device according to claim 1, wherein the first water-oxygen resistant film is in a direct contact with the circular polarizer film, the second water-oxygen resistant film is in a direct contact with the circular polarizer film and the color resistant film, and the third water-oxygen resistant film is in a direct contact with the color resistant film,
wherein the phase difference film and the polarization functional film are in a direct contact, and the polarization functional film and the supporting film are in a direct contact.

20. An organic electroluminescent display device, comprising: a base substrate, an organic electroluminescent pixel array provided on the base substrate and a packaging cover plate provided on the organic electroluminescent pixel array, wherein a light-emitting side of the organic electroluminescent display device is a side where the packaging cover plate is located, and the packaging cover plate is an optical film lamination;
the optical film lamination comprises: a supporting substrate, and a circular polarizer film, a plurality of water-oxygen resistant films and a color resistant film that are located on the supporting substrate; wherein
the supporting substrate is located on a side of the optical film lamination farthest from the organic electroluminescent pixel array;
a light-incident side of the circular polarizer film faces the supporting substrate;
a first water-oxygen resistant film and a second water-oxygen resistant film of the plurality of the water-oxygen resistant films are respectively arranged on two sides of the circular polarizer film and prevent water and oxygen from penetrating to the two sides of the circular polarizer film, the first water-oxygen resistant film is located on a light-exiting side of the circular polarizer film, and the second water-oxygen resistant film is located between the light-incident side of the circular polarizer film and the supporting substrate;

the color resistant film is located on the light-exiting side of the circular polarizer film; and a third water-oxygen resistant film of the plurality of water-oxygen resistant films is configured as a planarization layer and is provided on a surface of the color resistant film that is far away from the supporting substrate, and the first water-oxygen resistant film is arranged between the circular polarizer film and the color resistant film, wherein each of the plurality of the water-oxygen resistant films comprises one of or a combination of:

an inorganic material film; and a lamination of inorganic material film, organic material film, and inorganic material film laminated in sequence, wherein the circular polarizer film comprises: a phase difference film, a polarization functional film and a supporting film that are laminated in sequence.

* * * * *